United States Patent
Coglitore et al.

(10) Patent No.: US 7,724,513 B2
(45) Date of Patent: May 25, 2010

(54) CONTAINER-BASED DATA CENTER

(75) Inventors: Giovanni Coglitore, Saratoga, CA (US); Lawrence B. Seibold, San Jose, CA (US); Jason Enos, Healdsburg, CA (US); Conor Malone, Cupertino, CA (US)

(73) Assignee: Silicon Graphics International Corp., Fremont, CA (US)

( * ) Notice: Subject to any disclaimer, the term of this patent is extended or adjusted under 35 U.S.C. 154(b) by 62 days.

(21) Appl. No.: 11/860,685

(22) Filed: Sep. 25, 2007

(65) Prior Publication Data

US 2008/0094797 A1 Apr. 24, 2008

Related U.S. Application Data

(60) Provisional application No. 60/826,873, filed on Sep. 25, 2006.

(51) Int. Cl.
*H05K 7/20* (2006.01)
*H05K 5/00* (2006.01)
*G06F 1/20* (2006.01)

(52) U.S. Cl. .................... 361/679.47; 361/679.48; 361/679.5; 361/679.51; 361/679.53; 361/695; 361/696; 361/698; 361/699; 361/701; 165/104.33; 454/184

(58) Field of Classification Search ............ 361/679.46, 361/679.48–679.51, 690, 692, 694–696, 361/698, 701; 62/259.2; 165/80.3, 80.4, 165/104.33, 121–122; 174/16.1; 312/223.2, 312/236; 454/154

See application file for complete search history.

(56) References Cited

U.S. PATENT DOCUMENTS 3,203,143 A * 8/1965 Swenson .................. 52/64

(Continued)

FOREIGN PATENT DOCUMENTS

GB 2444981 A * 6/2008

(Continued)

OTHER PUBLICATIONS

Baumgart, B. et al., "Petabyte Box for Internet Archive," http://www.Baumgart.org/petabytebox.pdf, Nov. 8, 2003, 6 pages.

(Continued)

*Primary Examiner*—Jayprakash N Gandhi
*Assistant Examiner*—Robert J Hoffberg
(74) *Attorney, Agent, or Firm*—Cooley Godward Kronish LLP

(57) ABSTRACT

A computing system and method of operating a computing system is provided. The computer system includes: a housing comprising a shipping container having a first interior lateral wall and a second interior lateral wall; a first row of equipment provided along the first interior lateral wall with a first exhaust region between the first row of equipment and the first interior lateral wall; a second row of equipment provided along the second interior lateral wall with a second exhaust region between the second row of equipment and the second interior lateral wall; and an aisle provided between the first row of equipment and the second row of equipment; wherein said first and second rows of equipment each comprise a plurality of rack assemblies and a plurality of computers supported by the plurality of rack assemblies such that front sides of the computers face the aisle and back sides of the computers face either the first or second interior lateral walls, said front and back sides of the computers including vents enabling cooling air to pass through the computers between the aisle and the first and second exhaust regions.

8 Claims, 11 Drawing Sheets

U.S. PATENT DOCUMENTS

| | | | |
|---|---|---|---|
| 6,305,180 | B1 | 10/2001 | Miller et al. |
| 6,786,056 | B2 | 9/2004 | Bash et al. |
| 6,859,366 | B2 * | 2/2005 | Fink .......................... 361/690 |
| 6,896,612 | B1 * | 5/2005 | Novotny .................... 454/184 |
| 7,259,963 | B2 * | 8/2007 | Germagian et al. ......... 361/695 |
| 7,266,964 | B2 * | 9/2007 | Vogel et al. ................ 62/259.2 |
| 7,278,273 | B1 | 10/2007 | Whitted et al. |
| 7,283,358 | B2 * | 10/2007 | Campbell et al. ........... 361/694 |
| 7,319,594 | B2 * | 1/2008 | Nicolai et al. ............... 361/724 |
| 7,365,973 | B2 * | 4/2008 | Rasmussen et al. ......... 361/694 |
| 7,397,661 | B2 * | 7/2008 | Campbell et al. ........... 361/696 |
| 7,403,391 | B2 * | 7/2008 | Germagian et al. ......... 361/695 |
| 7,447,022 | B2 * | 11/2008 | Murakami et al. .......... 361/695 |
| 7,511,960 | B2 | 3/2009 | Hillis |
| 7,525,207 | B2 | 4/2009 | Clidaras et al. |
| 7,551,971 | B2 | 6/2009 | Hillis |
| 2006/0082263 | A1 * | 4/2006 | Rimler et al. ............... 312/201 |
| 2006/0139877 | A1 * | 6/2006 | Germagian et al. ......... 361/695 |
| 2007/0102946 | A1 * | 5/2007 | Blackwell et al. ........ 296/24.38 |
| 2007/0135032 | A1 * | 6/2007 | Wang ......................... 454/184 |
| 2007/0167125 | A1 * | 7/2007 | Rasmussen et al. ......... 454/184 |
| 2008/0060372 | A1 * | 3/2008 | Hillis et al. ................ 62/259.2 |
| 2008/0060790 | A1 * | 3/2008 | Yates et al. ................ 165/80.3 |
| 2008/0062647 | A1 * | 3/2008 | Hillis et al. ................. 361/699 |
| 2008/0064317 | A1 | 3/2008 | Yates |
| 2008/0123288 | A1 * | 5/2008 | Hillis ......................... 361/687 |

FOREIGN PATENT DOCUMENTS

| | | |
|---|---|---|
| JP | 2005172309 A * | 6/2005 |
| WO | WO 2005112578 A2 * | 12/2005 |
| WO | PCT/US2007/079422 | 4/2008 |

OTHER PUBLICATIONS

Cringley, R., "The Google Cube: Taking over the digital world four ounces at a time," http://www.pbs.org/cringely/pulpit/2005/pulpit_20051124_00474.html, Nov. 24, 2005, 3 pages.

Cringley, R., "Google-Mart: Sam Walton Tought Google More About How to Dominate the Internet Than Microsoft Ever Did," http://www.pbs.org/cringely/pulpit/2005/pulpit_20051114_000873.html, Nov. 17, 2005, 3 pages.

Markoff, J., "It's a Shipping Container. No, It's a Data Center in a Box," New York Times, Oct. 17, 2006, 2 pages.

Project Blackbox, "Join us to preview the world's first datacenter in a box," http://www.sun.com/emrkt/blackbox/index.jsp, 2 pages.

"Project Blackbox: The First Virtualized Datacenter," (undated) 7 pages.

* cited by examiner

CONTAINER-BASED DATA CENTER

CROSS-REFERENCE TO RELATED APPLICATION

This application claims the benefit of U.S. Provisional Application No. 60/826,873, filed Sep. 25, 2006, entitled "Container-Based Data Center", the disclosure of which is incorporated by reference in its entirety.

BACKGROUND

The data center has become a fixture of Information Technology (IT) environments. As the size and densities of modern data centers has increased, the power and cooling demands of the computer systems running or installed in the data centers has also increased dramatically. In addition, the design, construction, and deployment of a new data center typically requires a tremendous amount of time and cost.

In a typical data center, the computers are stacked in racks and arranged in repeating rows or cells. A standard rack that is widely used measures roughly 19 inches wide, 30 inches deep, and 74 inches high. These racks may be arranged in rows of, for example, roughly 10-30 units, with access doors on each side of the racks. Access aisles are provided on both sides of the rows so that an operator may approach the access doors on each side. Many of the racks are filled with cumbersome computers mounted on sliders and attached to the racks through mounting holes provided in the front and back of the rack.

In conventional rack-based computer systems, a plurality of computers are supported in a single stack in a rack. The rack may include a rack assembly having a front door and a back door. Each of the computers typically includes a computer chassis having a motherboard and other components, such as one or more power supplies, hard drives, processors, expansion cards, contained within the chassis. The front door of the rack assembly provides access to the front sides of the computers and the back door provides access to the back sides, where the I/O ports for the computers are typically provided. Each computer may also include one or more fans that draw ambient air into vents provided on one side of the computer, through the computer chassis, and out of vents provided on the opposite side of the computer. The ambient air passing through the computers is used to cool the various components contained within the computer chassis.

Due to the cost and complexity of deploying new data centers or expanding existing data centers, it would be desirable to be able to deploy new computers in a more effective fashion.

SUMMARY

A computing system is provided, comprising: a housing comprising a shipping container having a first interior lateral wall and a second interior lateral wall; a first row of equipment provided along the first interior lateral wall with a first exhaust region between the first row of equipment and the first interior lateral wall; a second row of equipment provided along the second interior lateral wall with a second exhaust region between the second row of equipment and the second interior lateral wall; and an aisle provided between the first row of equipment and the second row of equipment; wherein said first and second rows of equipment each comprise a plurality of rack assemblies and a plurality of computers supported by the plurality of rack assemblies such that front sides of the computers face the aisle and back sides of the computers face either the first or second interior lateral walls, said front and back sides of the computers including vents enabling cooling air to pass through the computers between the aisle and the first and second exhaust regions.

A computing system is provided, comprising: a housing having a first interior lateral wall and a second interior lateral wall; a first row of equipment provided along the first interior lateral wall, wherein said equipment comprises a plurality of rack assemblies and a plurality of air mover modules; and a first exhaust region between the first row of rack assemblies and the first interior lateral wall such that air exhausted out of the back sides of computers supported by the plurality of rack assemblies is received into the first exhaust region and withdrawn from the first exhaust region by the plurality of air mover modules.

A method of operating a computing system is provided, comprising: operating a plurality of computers contained in a housing comprising a shipping container, said computers being supported in first and second rows of equipment provided along opposite interior walls of the shipping container; and moving cooling air between exhaust regions located between back sides of the computers and the interior walls and an aisle located between the first and second rows of equipment.

DETAILED DESCRIPTION

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Some portions of the detailed description which follows are presented in terms of procedures, steps, logic blocks, processing, and other symbolic representations of operations on data bits that can be performed on computer memory. Each step may be performed by hardware, software, firmware, or combinations thereof.

As used herein, the singular forms "a", "an" and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

Container-Based Data Center Module

Figure 1A:
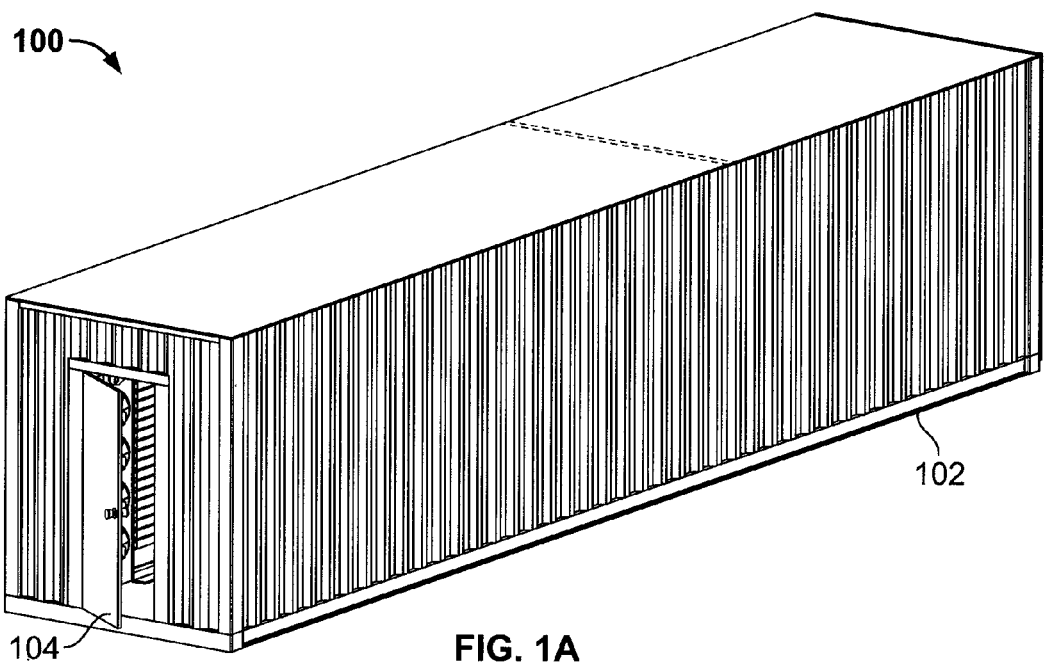
FIG. 1A is a front perspective view of a container-based data center module.
Figure 1B:
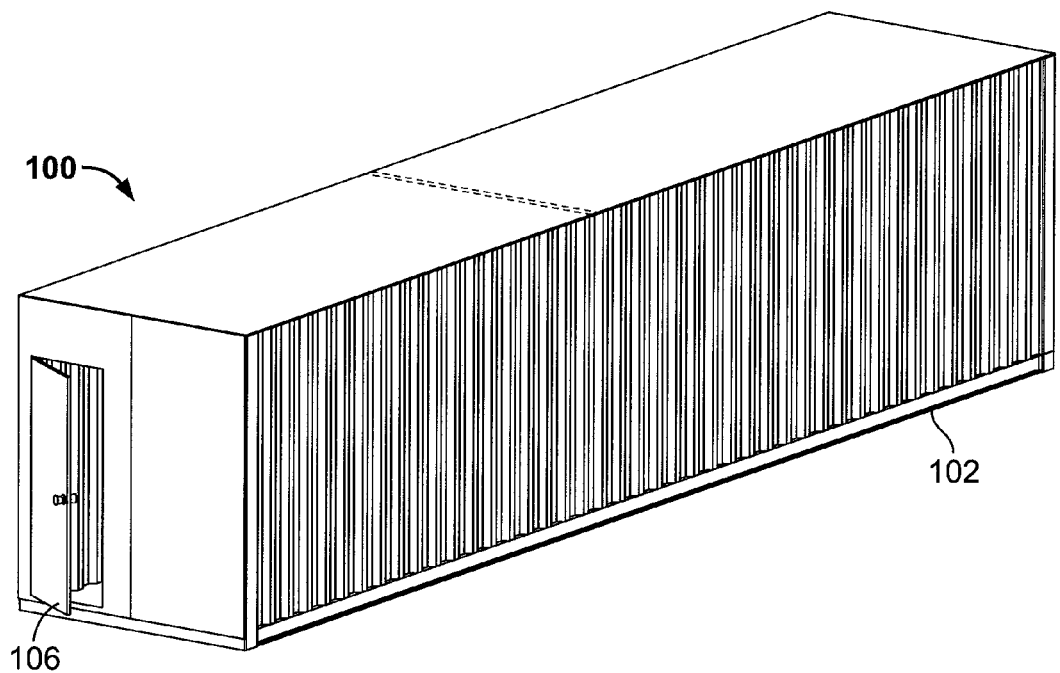
FIG. 1B is a rear perspective view of a container-based data center module.

Methods and systems for operating a data center are provided. FIGS. 1A-1B are front and rear perspective views of a container-based data center module 100, in accordance with example embodiments. The data center module 100 may comprise a housing 102 which may be, for example, a standard or modified shipping container. One or more access doors may be provided in the housing 102 to enable people to enter the housing 102 (front door 104 and rear door 106 are shown in FIGS. 1A-1B).

Shipping containers come in a variety of sizes and are readily available for use in shipping cargo on container ships, railroad cars, and trucks, and come in a variety of standard sizes, such as 20'L×8.5'H×8'W and 30'L×8.5'H×8'W. Other types of containers may vary in length from, e.g., 20' to 40' in length, 8' to 9.5' in height.

The data center module 100 may include some or all of the components necessary for operating a data center. In particular, the data center module 100 may provide one or more the following services: power, cooling, network connectivity, and the physical structure for housing all of the equipment in the data center 100. During manufacturing, the various hardware components housed in the data center (e.g., servers, storage equipment, and network equipment, such as switches, routers, and terminal servers) can be mounted onto racks contained in the data center 100 and cabling connected. The configuration of hardware can be made according to predefined standard configurations or to a customer's specific order.

The data center module 100 with all hardware installed inside (or a portion of the hardware installed) can then be shipped to the customer's desired location. Because the data center module 100 is housed in a standard-sized shipping container, the infrastructure for transporting the data center module 100 exists throughout the world. In particular, the data center module 100 can be transported using a combination of ships, trains, and container trucks. Many warehouses and ports throughout the world are already equipped to handle these containers. Therefore, the transportation to the desired location can be done easily and inexpensively.

Once the data center module 100 arrives at the desired location, power and network connectivity is provided and the data center module 100 can immediately begin operation. The power can be supplied using one or more utility feeds providing, e.g., 100A three-phase power. One or more power distribution units (PDU) may be housed in the data center module 100 for receiving the three-phase power. No other assembly, cabling, or software configuration need be performed. In most cases, it would be desirable to run tests to confirm that the equipment had not been damaged during transit, but since the cabling and configuration had been performed during initial assembly, it is not necessary to have a team of skilled installation personnel available to get the data center operational.

Due to the ease with which the data center module 100 can be transported, the data center module 100 can be assembled in a low cost region and then inexpensively shipped anywhere in the world. Another potential advantage is that the data center module 100 can easily be relocated. Conventional data centers are very expensive to construct and any relocation requires an extensive amount of disassembly, transportation of individual components, and reassembly at the new location. Such a relocation would be extremely expensive and time consuming. In contrast, the data center module 100 can simply be disconnected from the power and network connections provided at the current location and shipped to a new location using the same standard container shipping methods used to initially deliver the data center module 100. There is no need to disconnect each computer and manually move each rack to the new location.

Figure 2A:
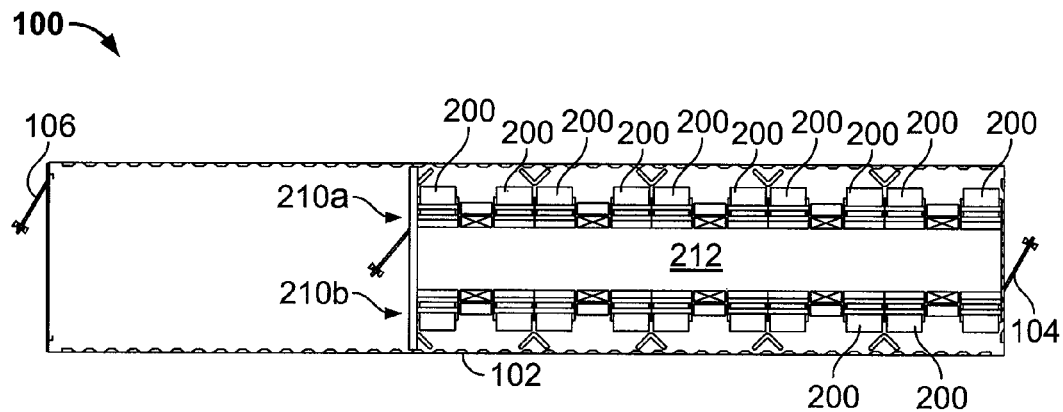
FIG. 2A is a top view of a data center module.
Figure 2B:
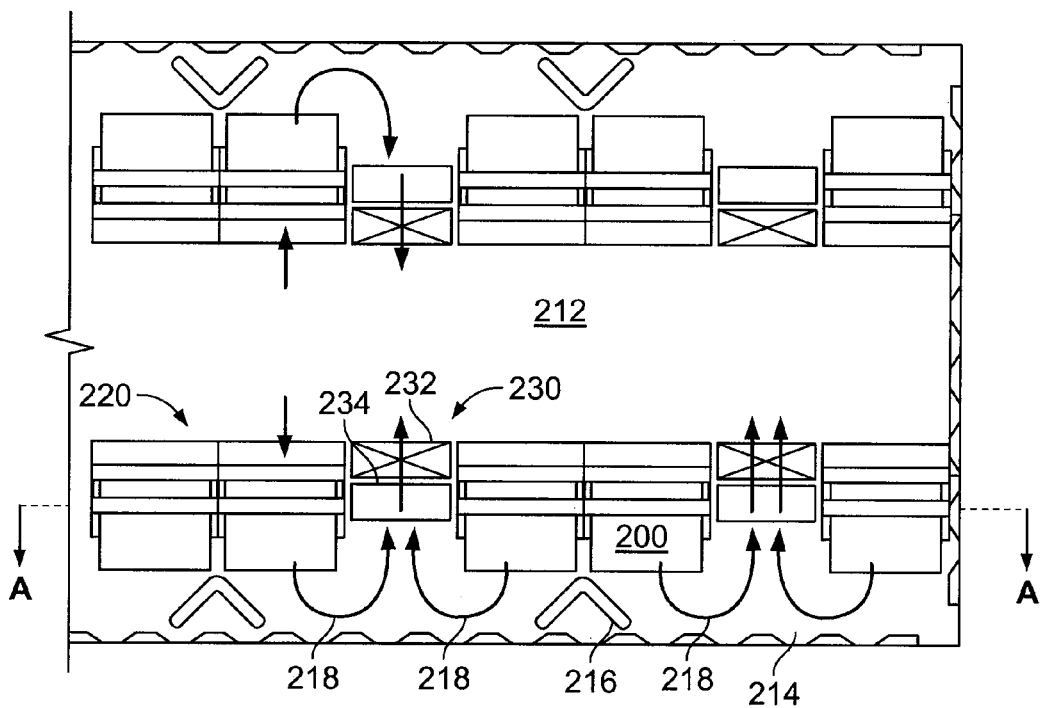
FIG. 2B is an enlarged portion of the view shown in FIG. 2A.
Figure 3A:
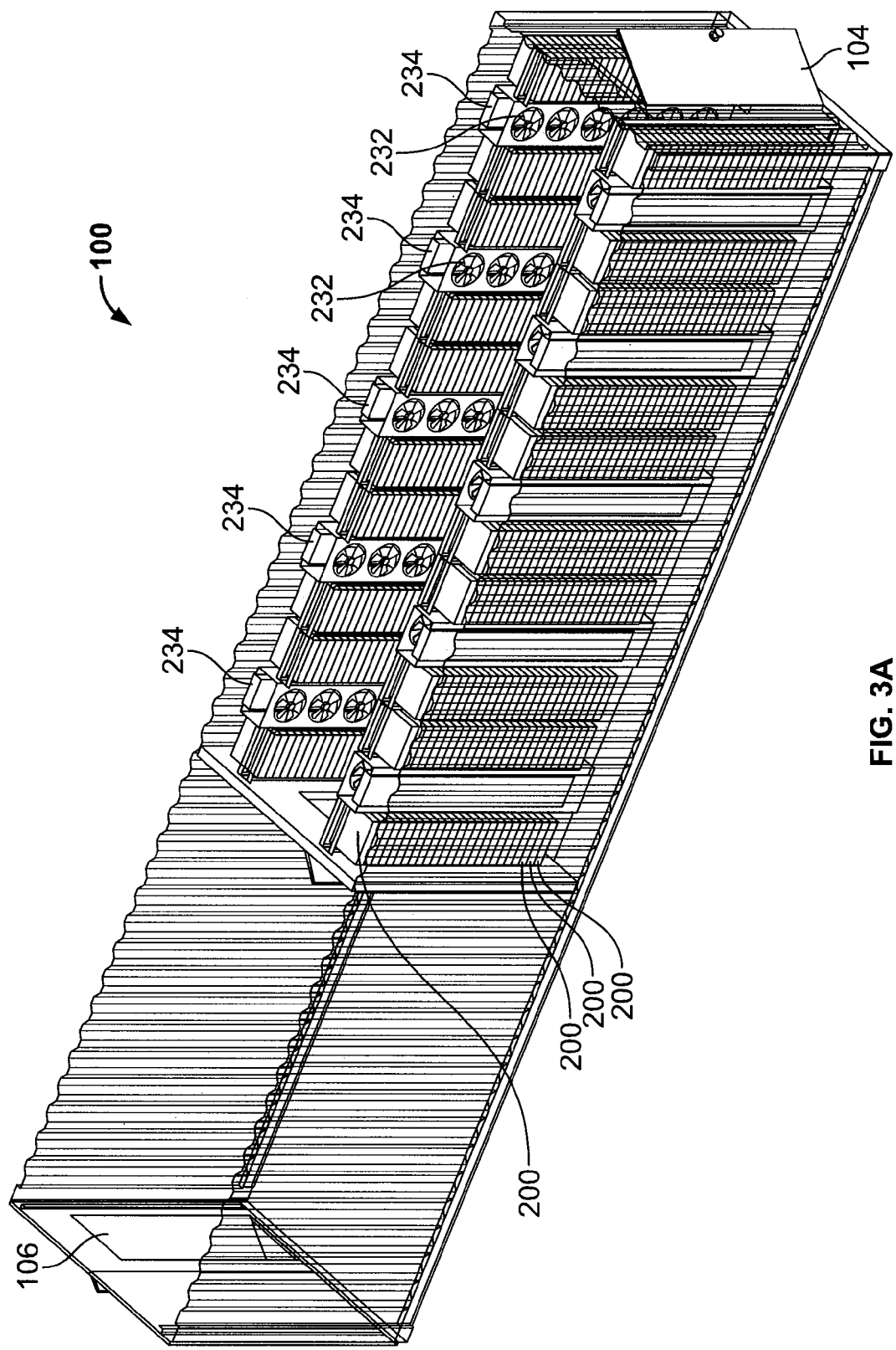
FIG. 3A is a perspective view of a data center module.
Figure 3B:
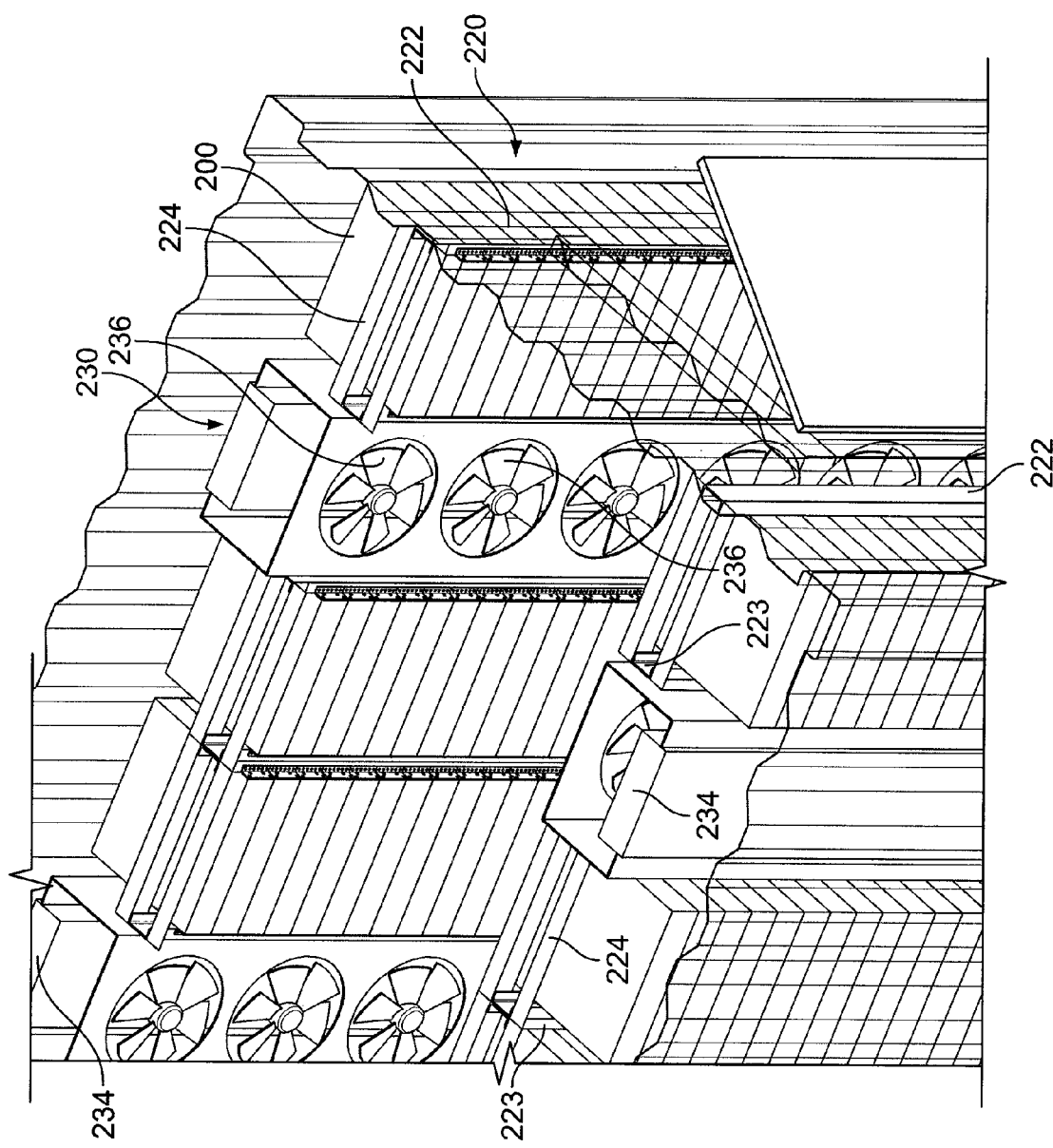
FIG. 3B is an enlarged portion of the view shown in FIG. 3A.

A plurality of computers 200 may be provided in the data center module 100 in a variety of configurations. FIG. 2A is a top view of an example configuration of computers 200 in the data center module 100. FIG. 2B is an enlarged portion of the view shown in FIG. 2A. FIG. 3A is a perspective view of the data center module 100 with the walls of the housing 102 shown as semi-transparent for clarity. FIG. 3B is an enlarged portion of the view shown in FIG. 3A.

In the illustrated embodiment, the computers 200 are mounted onto rack assemblies 220. The rack assemblies 220 are provided in two rows 210a-210b separated by a central aisle 212 to enable an administrator to access the computers 200. In some embodiments, the interior of the housing 102 may be separated by a wall 228 into a first compartment 225 and a second compartment 226. The wall 228 may be provide a full or partial seal (thermal and/or RF) between the compartments, and a door 229 may be provided to enable an administrator to pass from one compartment to the next. In some embodiments, the second compartment 226 may be used, e.g., to provide office space and a workstation for an administrator, to house the equipment used for the cooling of the first compartment 225, or for other non-computing functions. In other embodiments, the second compartment 226 may be smaller, larger, or omitted altogether.

The rack assemblies 220 may be provided in a variety of forms, but in the illustrated embodiment comprise a pair of vertical support members 222-223 separated by a gap of, e.g., 17.75 inches. The support members 222-223 are provided with a plurality of holes at regular intervals so that each hole is part of a horizontal pair with a center-to-center distance of, e.g., 18.3 inches. Each of the computers 200 are attached to and supported by the vertical support members 222-223 using thumbscrews or pins or the like. In some embodiments, horizontally-arranged rails may be provided for supporting the computers 200 in the rack assembly 220. In other embodiments, the rails may be omitted. Horizontally-arranged cross-bracing 224 may also be provided in order to provide additional structural support for the rack assembly 220.

Each computer 200 is a general purpose computer system designed to perform computations and/or data processing, and typically includes a central processing unit (CPU) and memory. The CPU and memory may be provided on a printed circuit board (PCB) motherboard, which is the main circuit board of the computer that makes it possible for the other parts of the computer to communicate with each other. The PCB motherboard may be mounted onto a chassis structure, such as, for example, a sheet of metal or a supporting frame. Multiple computer components, such as, e.g., hard drives, power supplies, processors, memory modules, cables, or additional boards, etc., may be mounted on or coupled to the motherboard of the computer or chassis structure. Some computers 200 include a generally rectangular housing having vents provided on two or more sides, which allow cooling air to be passed through the housing to cool the various components contained inside the housing. Fan assemblies may be included for moving the air through the computers. The housing may also include flanges or other mechanical structures which facilitate the mounting of the computer 200 in a rack assembly 220. Alternatively, the computer 200 may comprise a printed circuit board (PCB) having exposed components without an enclosure.

In some embodiments, the computers 200 in the rack assembly 220 comprise server-class computers. A server is a computer on a network that may, among other tasks, manage network resources. The server may be dedicated to a particular purpose and may store data and/or perform various functions for that purpose. In some embodiments, storage arrays may also be mounted in the rack assembly 220.

Each of the computers 200 may have a front side and an opposing back side, a top and an opposing bottom, and two opposing lateral sides. The computers 200 may be configured so that all components and/or ports requiring periodic access by the system administrator are provided on the front sides of the computers (e.g., the sides facing the central aisle 212). Suitable computers are described in U.S. Pat. No. 6,496,366, to Coglitore et al., filed on Jan. 7, 2000, incorporated by reference herein in its entirety.

In the systems described in U.S. Pat. No. 6,496,366, the cooling air flows into the front sides of back-to-back stacks of computers and is exhausted into a central plenum between the stacks. The heated air is then exhausted upwards and/or downwards out of the plenum. In contrast, in the embodiment shown, the computers 200 in each row 210a-210b are configured so that the cooling air flows from the central aisle 212 into the front sides of the computers 200. This cooling air is used to cool the components contained in the computers 200 and is exhausted out of the back sides of the computers 200. In the illustrated embodiment, instead of exhausting the air into a central plenum provided between the two stacks of computers, as described in U.S. Pat. No. 6,496,366, the air is exhausted into an exhaust region 214 between the back sides of the computers 200 and the interior walls of the housing 102.

In accordance with example embodiments, air mover modules 230 are provided for drawing the air out of the exhaust region 214. The air mover modules 230 may comprise a fan assembly portion 232 and a cooling portion 234. The fan assembly portion 232 may comprise a plurality of air movers (such as, e.g., fans 236) which are provided along the vertical length of the rack assembly 220. In this embodiment, the fans 236 draw air from the exhaust region 214 and expel the air into the central aisle 212. The cooling portion 234 may comprise any of a variety of known cooling systems for removing heat from the air being drawn through the fan assembly portion 232. In other embodiments, the direction of the airflow may be reversed, such that the heated air is exhausted out of the front sides of the computers 200 into the central aisle 212. Then, the air is drawn into the air mover module 230, where it is cooled by the cooling portion 234 and expelled into the region 214. This cooled air is drawn into the back sides of the computers 200 to cool the internal components of the computers 200.

Figure 4:
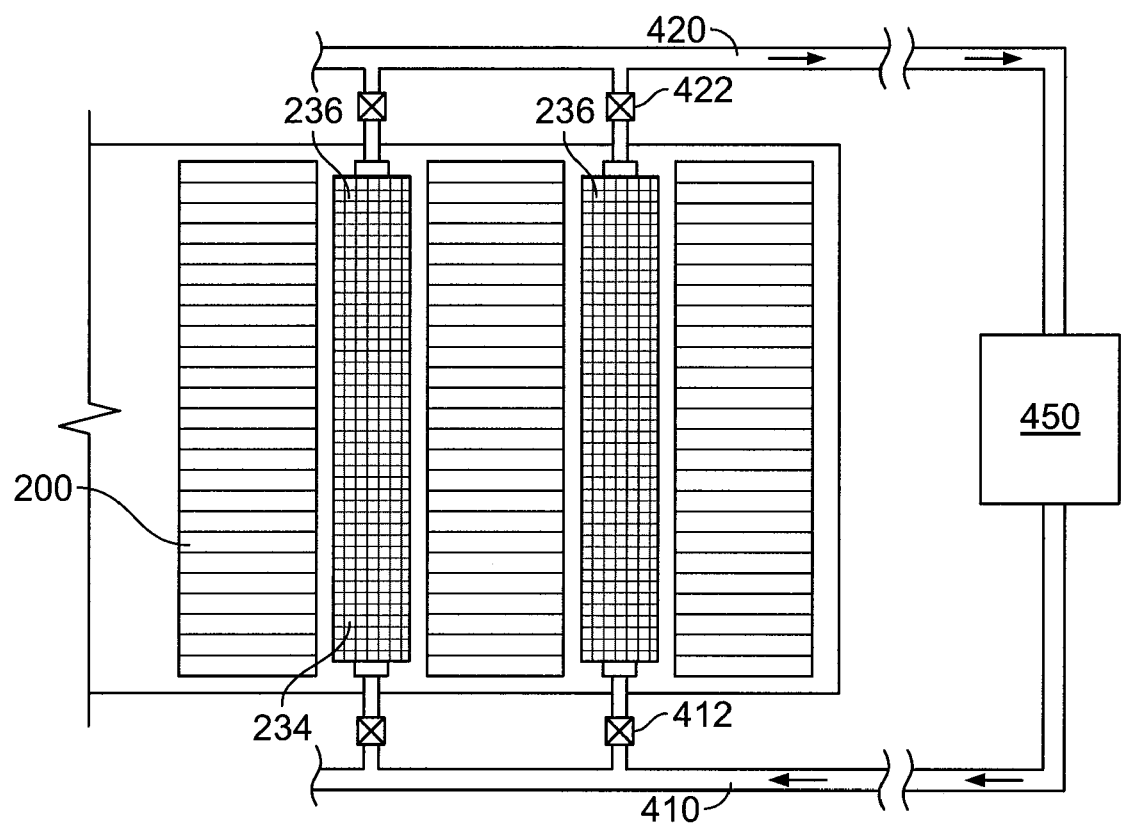
FIG. 4 shows a cooling system.

FIG. 4 shows a cooling system that may be used in accordance with example embodiments. In the embodiment shown, the cooling portion 234 comprises a radiator 236 which receives a heat transfer medium, such as a liquid coolant (e.g., water), from intake line 410, and expels the heat transfer medium via outlet line 420. Each radiator 236 may be connected to the intake line 410 via a valve 412 and outlet line 420 via valve 422. The valves 412, 422 may be provided to enable rapid replacement of failed radiators. The heat transfer medium (e.g., cooled water) passes through the radiator 236, where heat from the exhaust air drawn through the air mover modules 230 is absorbed by the heat transfer medium, thereby cooling the exhaust air. The cooled exhaust air is emitted into the central aisle 212, where it is again drawn into the front sides of the computers 200. The heat transfer medium is routed to a cooling system 450 via the outlet line 420. The cooling system 450 removes the heat from the heat transfer medium and returns the heat transfer medium to the intake line 410. A condensation collector and drain may be provided at the bottom of each radiator 236 in order to collect and remove any condensation that may be formed in the air mover modules 230.

Any of a variety of cooling systems 450 may be used to cool the heat transfer medium, examples of which are provided in greater detail below. In some embodiments, a dedicated cooling system 450 is provided for each data center module 100. In other embodiments, a central cooling system 450 is provided for a plurality of data center modules 100 in a single location. This can enable the use of larger, more efficient cooling systems.

In accordance with some embodiments, air deflectors 216 may be used for directing the flow of exhaust air in the exhaust region 214. In the embodiment illustrated in FIGS. 2A-2B, each air deflector 216 comprises two vertically-oriented panels coupled at an angle, and the rack assemblies 220 are provided in adjacent pairs separated by an air mover module 230. The air deflector 216 is positioned between two adjacent rack assemblies 220 so that the exhaust air from the computers 200 in a first rack assembly 220 is directed by a first panel towards the air mover module 230 adjacent to that first rack assembly 220, and the exhaust air from the computers 200 in a second rack assembly 220 is directed by a second panel towards the air mover module 230 adjacent to that second rack assembly 220, as shown by the arrows 218 in FIG. 2B. The use of the air deflectors 216 may reduce turbulence in the exhaust region 214 and improve the flow of air out of the computers 200 and through the air mover modules 230.

In some cases, if there is a sufficient seal between the rack assemblies 220, air mover modules 230, and walls of the housing 102, the fans 236 in the air mover modules 230 may be sufficient to draw the cooling air through the computers 200 without requiring the use of internal fans within the computer chassis of each computer 200.

Figure 5:
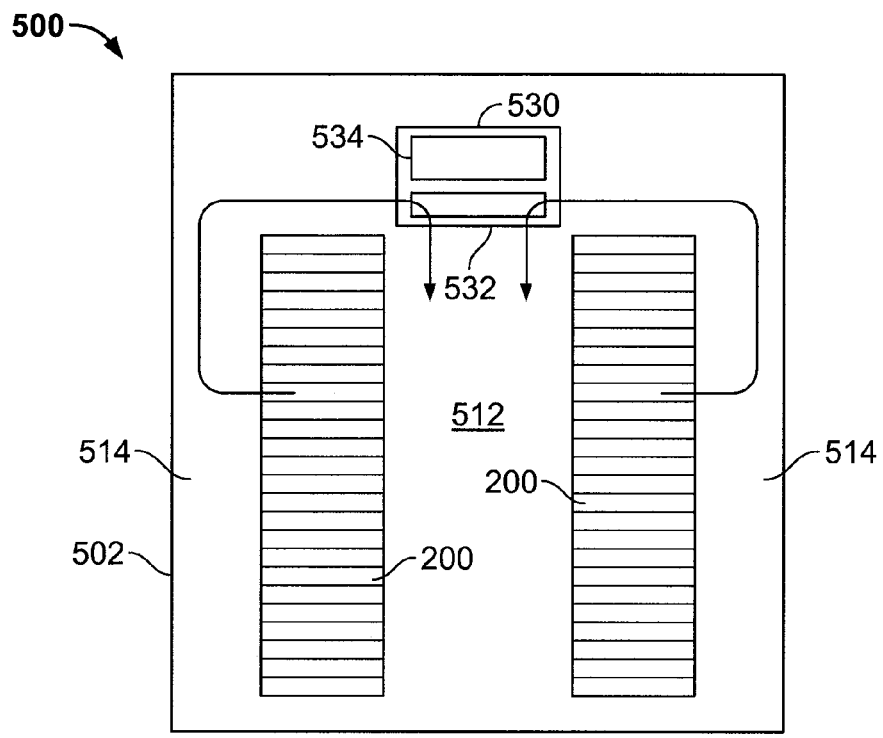
FIG. 5 is a front cross-sectional view of another data center module.
Figure 6:
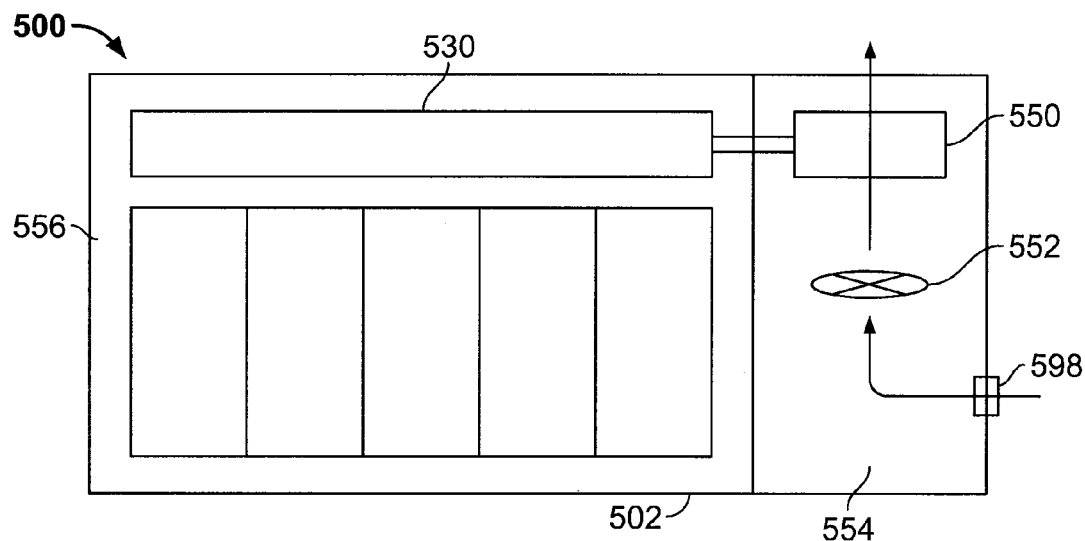
FIG. 6 is a side cross-sectional view of the data center module.

FIGS. 5-6 are front and side cross-sectional views of another data center module 500, in accordance with an example embodiment. In this embodiment, the module 500 is also housed in a container-based housing 502 and contains a plurality of computers 200 mounted on rack assemblies 220.

In contrast with the data center module 100 described above in which the exhaust air from the computers 200 is routed to laterally adjacent air mover modules 230, in the data center module 500 the exhaust air is routed upwards to an air mover module 530 provided in the ceiling region of the housing 502. The air mover module 530 comprises a fan assembly portion 532 for drawing the air from the exhaust region 514 through the air mover module 530. and a cooling portion 534 for cooling the air passing through the air mover module 530.

The cooled air is then returned to the central aisle 512, where it is again used to cool the computers 200.

The heat transfer medium used by the cooling portion 534 may be routed to a cooling system 550 for cooling. The cooling system 550 may be external to the data center module 100, similar to the cooling system 450 shown in FIG. 4, or may be contained in a separate cooling region 554 in the housing 502 that is sealed from the computing region 556 containing the computers 200. Cool air from outside the housing 502 may be drawn into the cooling region 554 by a fan 552 through an intake port 598. This cool air is then used to cool the heat transfer medium passing through the cooling system 550.

Figure 11:
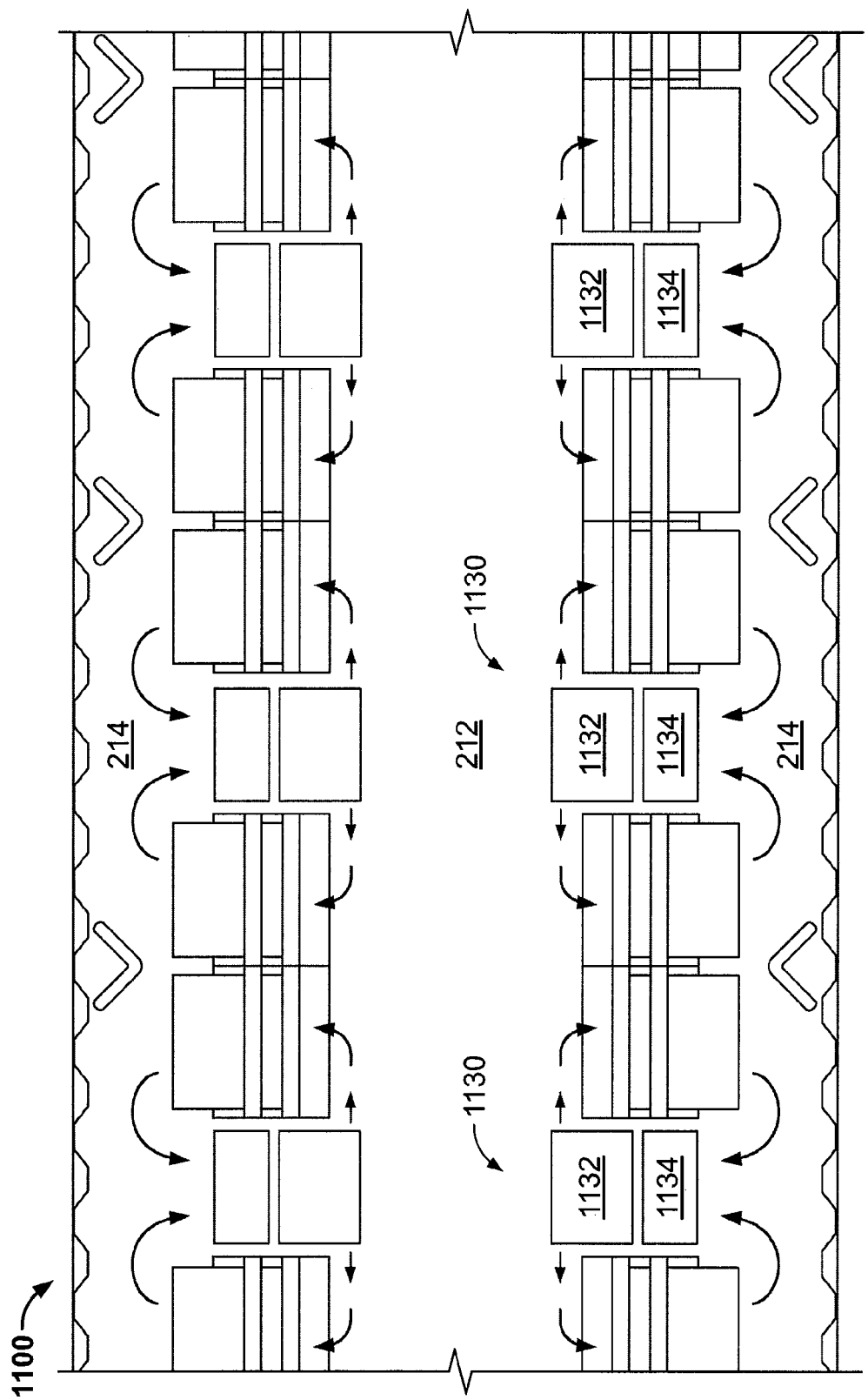
FIG. 11 is an enlarged top view of another data center module.
Figure 12:
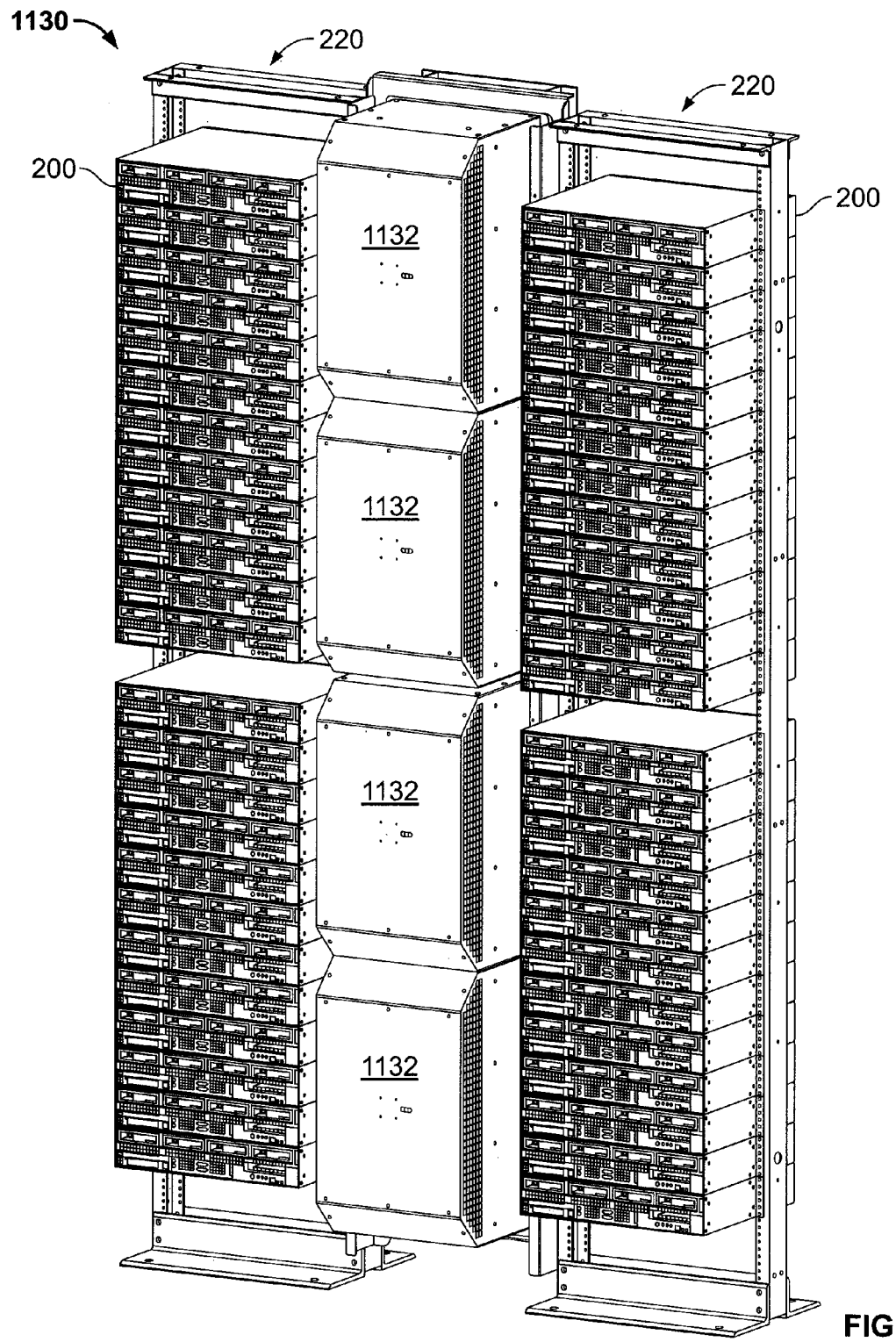
FIG. 12 is a perspective view of two rack assemblies having air mover modules provided therebetween.
Figure 13:
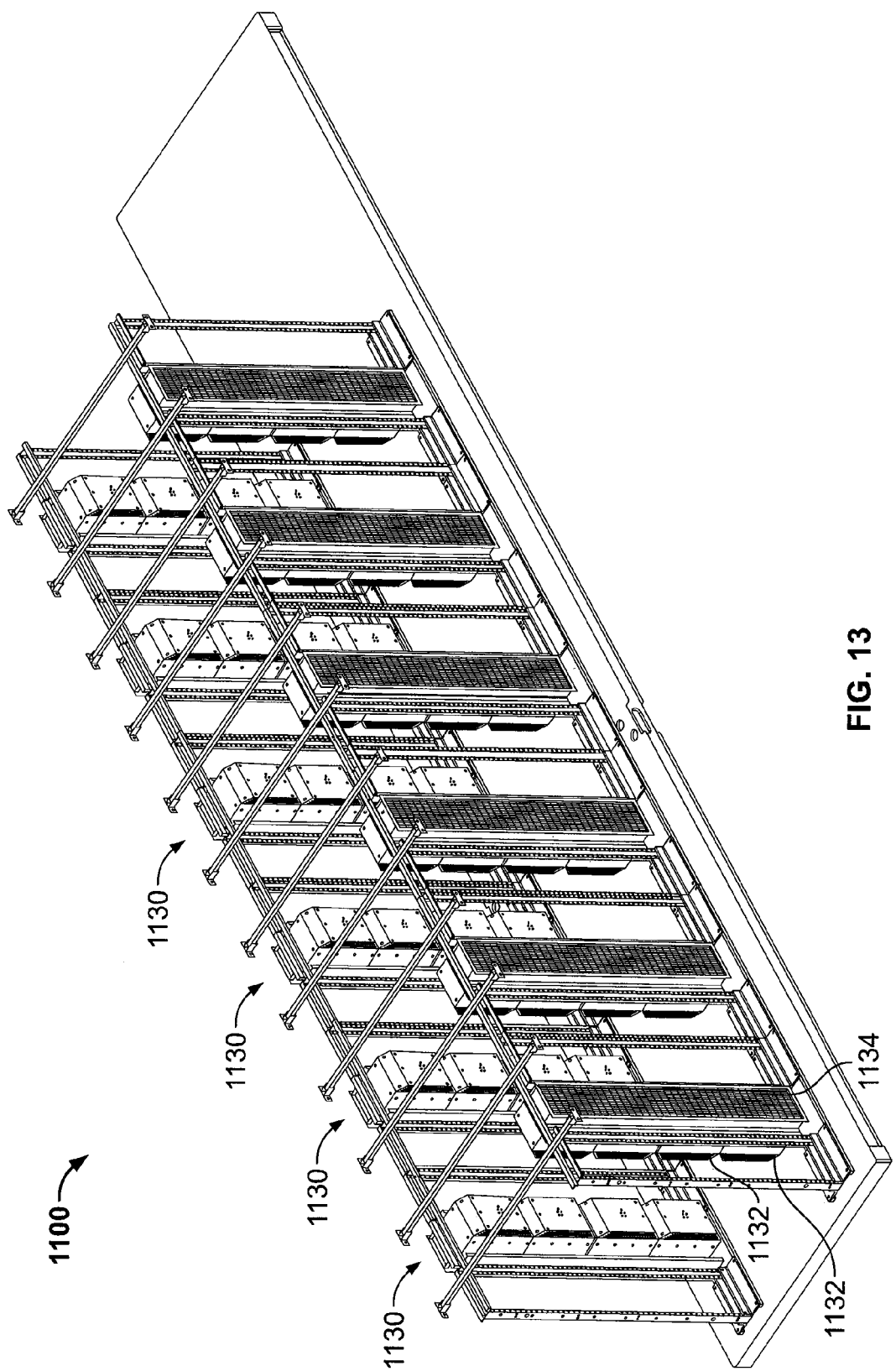
FIG. 13 is a perspective view of the data center module with the walls and computers removed for clarity.

FIGS. 11-13 are various views of another embodiment of a data center module 1100. This embodiment is similar to the embodiment described above with respect to FIGS. 1A-3B, except for the air mover modules. As shown in FIG. 2B, the air mover modules 230 comprise a plurality of axial propeller-type fans 236 which draw the air from the exhaust region 214 and push the air straight out of the front of the fan along the axis of the propellers into the central aisle 212.

In contrast, as shown in FIG. 11, the fan assemblies 1132 in the air mover modules 1130 direct cooled air laterally out of the sides of the fan assemblies 1132 across the front sides of the computers 200. The air is cooled by the cooling portion 1134. The air is then drawn into the front sides of the computers 200 and used to cool the components of the computers 200. This arrangement can provide improved airflow and movement through the computers 200.

FIG. 12 is a perspective view of two rack assemblies 220 having the air mover modules 1130 provided therebetween. FIG. 13 is a perspective view of the data center module 1100 with the walls and computers 200 removed.

Various types of air movers may be used in the fan assemblies 1132. In the illustrated embodiment, each air mover module 1130 includes four vertically-arranged fan assemblies 1132, with each fan assembly including a single centrifugal fan, which draw air from the exhaust region 214 and blows the air at right angles to the intake of the fans.

Computer I/O

In accordance with example embodiments, the computers 200 are configured such that the back sides of the computers 200 face the housing 102 of the data center module 100 and the front sides of the computers 200 face the central aisle 212. As a result, after the rack assemblies 220 are filled with computers 200 and air mover modules 1130, it is difficult or impossible for a technician to access the back sides of the computers 200 without removing the computers 200 from the rack assemblies 220. Thus, in some embodiments, all of the ports and components which may be accessed by the technician for routine maintenance and servicing are accessible from the front sides of the computers 200 such that they may be easily accessed by a technician standing in the central aisle 212.

In some embodiments, the ports and components accessible from the front side of the computers include all ports and components that would be accessed by a technician during servicing that does not require that the computer 200 be shut down. For example, all network ports and data I/O ports are accessible on the front side of the computers. In addition, all hot swap components, such as, e.g., hard drives or redundant power supplies, may be accessible from the front side of the computer. An exemplary computer that may be used are the Half-Depth Servers sold by Rackable Systems, Inc., of Milpitas, Calif.

Power

In accordance with example embodiments, each rack assembly 220 is provided with its own uninterruptible power supply (UPS), which maintains a continuous supply of electric power to the computers 200 mounted in that rack assembly 220 by supplying power from a battery when utility power is not available.

Insulated Module Housing

In accordance with example embodiments, the housing containing the computers is isolated from environmental influences. In particular, the entire housing or the portion of the housing containing the computers is may be provided with one or more characteristics of being thermally insulated, air tight, and Radio Frequency (RF) sealed. In some embodiments, the entire housing may have all three characteristics. The extent of isolation may vary, depending on the desired application and the severity of the environment in which the data center module is deployed.

The thermal insulation enables the data center module to be provided in an environment that does not have temperature regulation, such as the outdoors. Thus, the computers contained in the data center module are not affected by changes in environmental temperature.

Providing an air tight or substantially air tight seal prevents contaminants in the environmental air from entering the computers. In accordance with some embodiments, the air exhausted from the computers is cooled and recirculated back to cool the computers without being exchanged or mixed with air from outside the data center module. This can result in a reduction or elimination of the need for air filtration and static protection in the air handling system since contamination from external air is avoided. As a result, the data center module may be deployed in high humidity, high precipitation, and/or high dust environments without substantially impacting the operation of the cooling airflow.

RF sealing may be provided for the housing in order to satisfy federal regulations for RF emissions. In conventional data centers, each rack-mounted computer includes a chassis that provides the levels of RF sealing required by the relevant authority (e.g., the Federal Communication Commission). This increases the cost of each computer, thereby substantially increasing the cost of the data center construction. In contrast, if the entire container or at least the region of the container within which the computers are contained is provided with the required level of RF sealing, the amount of RF sealing provided for each individual computer may be reduced.

Cooling of Data Center Modules

In accordance with example embodiments, the housing of the data center module is not thermally insulated. Instead, the walls of the housing are thermally conductive so as to draw heat from the interior of the housing to the exterior, where the heat is drawn away from the exterior walls of the housing by the air flowing past the housing. The airflow past the exterior of the housing may be provided by wind or may be forced air provided by fans or other air movers. In some embodiments, the airflow past the exterior of the housing may be cooled using any of a variety of cooling systems. For example, evaporative cooling systems may be used to cool the air before passing the air over the exterior of housing. This arrangement may help to reduce the burden on the cooling system contained within the data center module.

Due to the standard sizing of the container-based housing, the data center module may be easily delivered to the target site using any of a variety of conventional container-based transportation systems (e.g., truck, train, boat, etc.). In some embodiments, improved cooling may be effectuated by attaching thermally-conductive heat fins to the exterior walls of the housing after the data center module is shipped to the target site.

Figure 7:
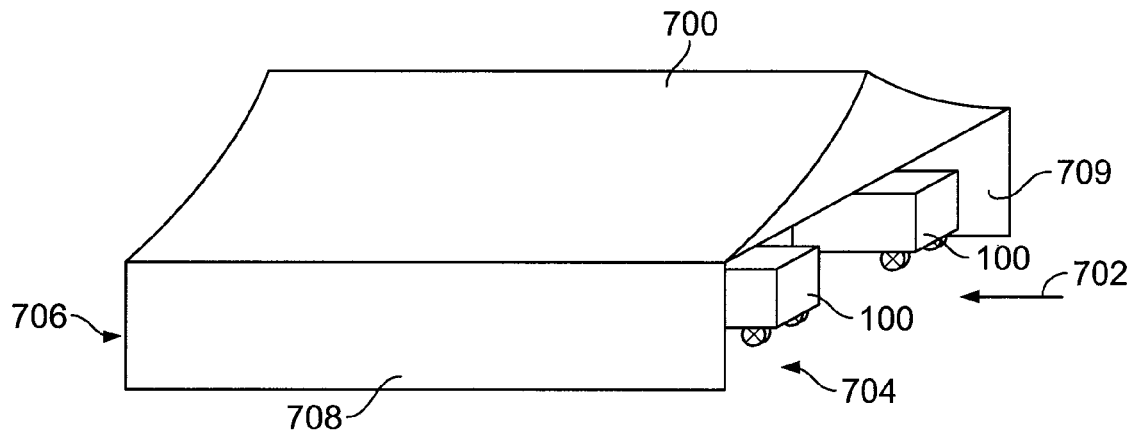
FIG. 7 is a perspective view of a canopy used to shade data center modules.
Figure 8:
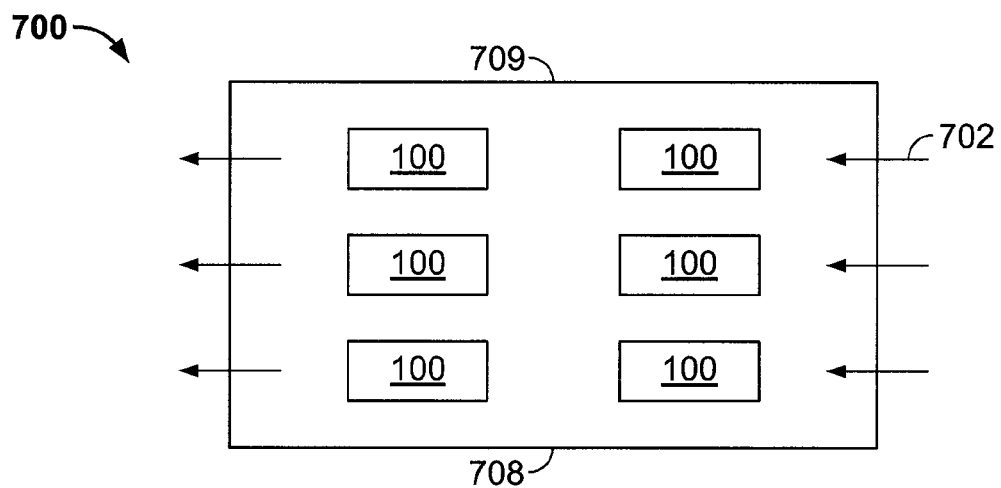
FIG. 8 is a simplified top view of the interior of the canopy.

FIG. 7 is a perspective view of an embodiment in which a canopy 700 is used to shade the container-based data center modules 100 contained inside the canopy 700. FIG. 8 is a simplified top view of the interior of the canopy 700. This arrangement can help to reduce the solar load on the modules 100, while allowing cooling air 702 to pass over the exterior walls of the modules 100. In some embodiments, the canopy 700 includes two side walls 708-709 with an open front side 704 and an open back side 706. This can help to create a "wind tunnel" effect in which the cooling air is directed past the modules 100. Fans or other air movers may be used to increase and control the airflow 702. The canopy 700 may comprise a rigid, hard-walled structure, such as a simple framed building, or may be a temporarily-erected tent or other fabric-based covering.

Biogas Data Center Power Generation

In accordance with example embodiments, a data center (such as, e.g., one or more data center modules described above) may be deployed in a location with economical access to biogas. This biogas is then used to generate power for the data center. In some embodiments, the biogas source, which may comprise, e.g., a wastewater treatment plant, a landfill site, animal waste site, or food processing site, may be located directly adjacent to or beneath the data center location, thereby minimizing the cost of transporting the biogas from the biogas source. In other embodiments, the data center may be located in a site with inexpensive network connectivity access, and the biogas fuel is transported to the data center.

The use of biogas, such as methane generated by rotting garbage in landfill dumps, in order to generate electricity is known. Methane forms in a landfill site when organic waste decomposes in the absence of oxygen. The biogas can be collected and used as fuel for microturbine energy systems, which can provide power for the data center.

In some embodiments, the biogas is used to fuel a cogeneration system, or combined heat and power (CHP) system. This CHP system may be used to simultaneously generate both heat and electricity. The electricity is used to directly power the computers and other equipment in the data center. The heat from the power-generation equipment, such as the microturbines, may be used by an absorption chiller or absorption refrigerator, which utilizes heat to power a cooling system. The absorption chiller may then be used for cooling the data center modules, or may be used to cool the microturbines, thereby increasing the efficiency of the power generation. Alternatively, the efficiency of the microturbines may be increased by using evaporative coolers to provide cooled, humidified air to the microturbines.

Figure 9:
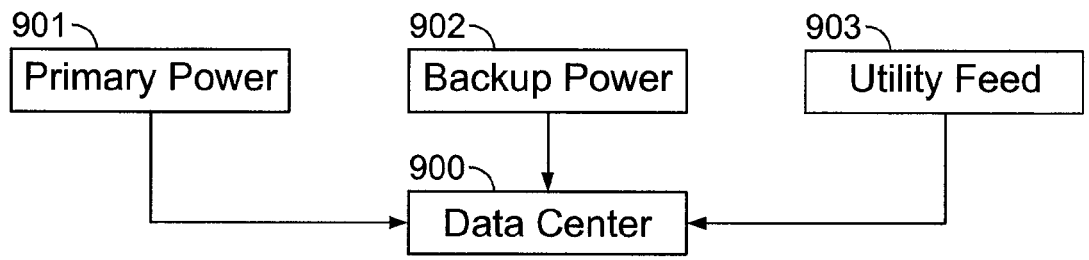
FIG. 9 is a block diagram illustrating a power system for a data center.

FIG. 9 is a block diagram illustrating a power system for a data center 900. In this embodiment, the primary power 901 for the data center 900 is provided by the biogas-fueled power-generation equipment. In some cases, the primary power 901 may be operated to produce more power than is consumed by the data center. In this case, the excess power may be provided back to the utility company for utility credits or other compensation. In other embodiments, the primary power 901 is used for "peak shaving", in which the primary power 901 is utilized when energy costs are high, and the utility feed 903 is used when energy costs are low. In some cases, the use of biogas may provide Environmental Protection Agency Clean Air Credits, which may be sold to other companies if not needed by the data center operator.

In some embodiments, the biogas-based primary power 901 provides all of the power utilized by the data center during normal operation. In the event of a failure in the power system, the data center may then utilize the utility feed 903 as an instantaneous uninterruptable power supply (UPS). This can dramatically reduce the cost of providing conventional UPS systems. In some embodiments, a back-up power system 902, such as diesel generators or batteries, may also be provided for further failover protection. In other embodiments, an alternate fuel source may be utilized as a further back-up to the biogas source. The biogas power generation system may be easily switched to an alternative fuel source, such as propane or natural gas. The propane can be inexpensively stored at the data center as a back-up fuel source, and natural gas may be provided by the local utility company.

On-Site Manufacturing

In accordance with example embodiments, the power generated by the biogas fuel source may be used to also power the assembly and testing of the computers to be installed in the data center. In conventional data center construction, the individual computers are typically assembled and tested off-site and then delivered to the data center location ready for use. In contrast, due to the efficiencies gained by utilizing the biogas-fueled power source, this assembly and testing may be performed on site.

Figure 10:
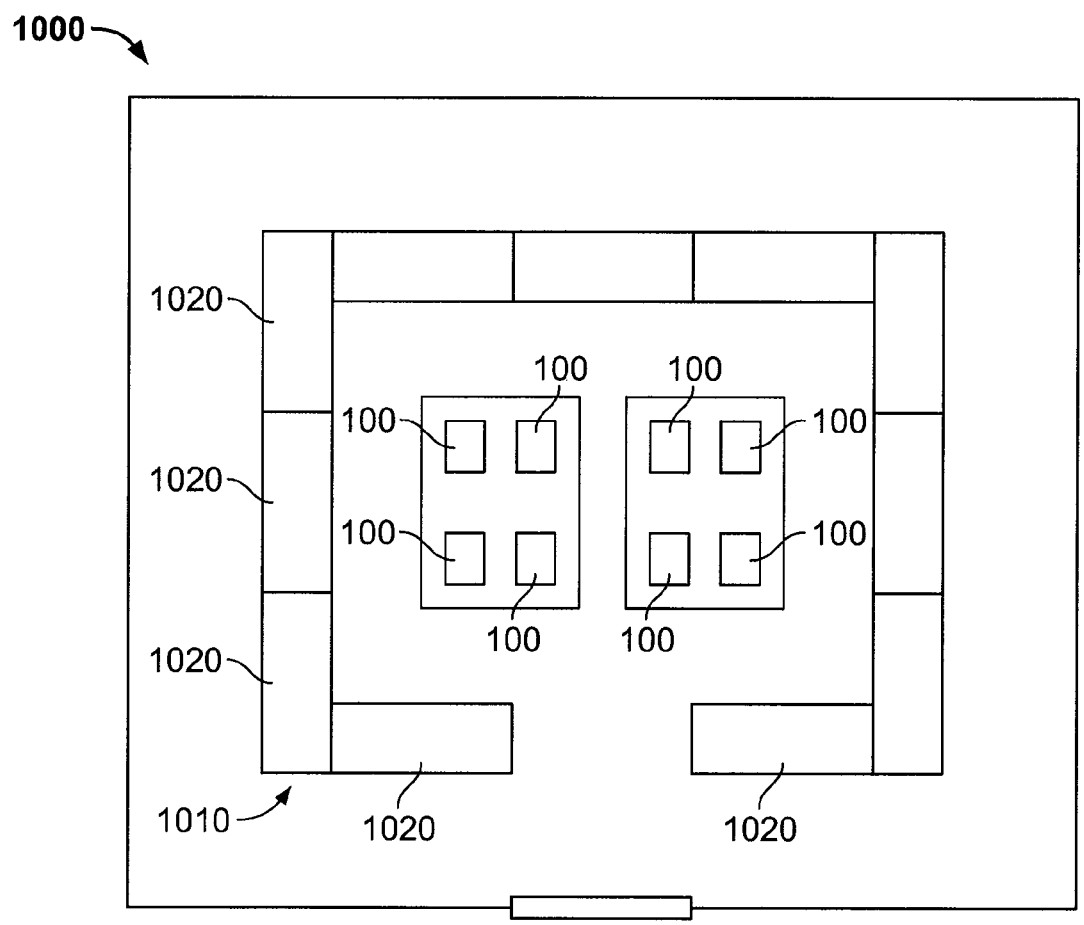
FIG. 10 is a simplified block diagram of a data center including an on-site manufacturing facility.

FIG. 10 is a simplified block diagram of a data center 1000 including an on-site manufacturing facility 1010. The manufacturing facility 1010 may comprise a plurality of manufacturing modules 1020. Each manufacturing module 1020 may include a housing formed out of a shipping container having identical or similar dimensions as the housings 102 of the data center modules 100. Because the manufacturing modules 1020 have the same form factor as the data center modules 100, both modules 100, 1020 may be delivered to the data center site using the same inexpensive transportation system. In some embodiments, the manufacturing modules 1020 may be deployed in a perimeter around the data center modules 100. Thus, the manufacturing modules 1020 may also provide physical security for the computers in the data center modules 100.

The housings 102, computers 200 (either fully assembled, partially assembled, or unassembled), and other components of the data center modules 100 may be delivered to the site of the data center 1000. Personnel working in the manufacturing modules 1020 can assemble smaller components of the data center modules 100, such as, e.g., installing various components of the computers 200. Personnel can then install the computers 200 and other components in the housings 102, which are located adjacent to the manufacturing modules 1020. After the assembly of the computers for the data center 1000 is complete, the manufacturing modules 1020 may be removed from the data center site, or, alternatively, may be converted into office or storage space for the data center operations.

Embodiments of the present invention may provide various advantages not provided by prior art systems. For instance, the use of biogas as a fuel may enable data center planners to select the data center location based on the availability of inexpensive network access, rather than the availability of inexpensive power.

While the invention has been described in terms of particular embodiments and illustrative figures, those of ordinary skill in the art will recognize that the invention is not limited to the embodiments or figures described. For example, in many of the embodiments described above, the cooling air flows into the front sides of the computers and out of the back sides. In other embodiments, the airflow may be reversed such that cool air is drawn into the back sides of the computers and exhausted out through the front sides.

In addition, in the embodiment described above with respect to FIG. 10, the data center 1000 and manufacturing facility 1010 are powered by biogas. In other embodiments, the container-based data center and on-site manufacturing facility may be powered using conventional power systems.

Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

What is claimed is:

1. A computing system, comprising:
   a housing having a first interior lateral wall and a second interior lateral wall;
   a first row of equipment provided along the first interior lateral wall, wherein said first row of equipment comprises a first plurality of rack assemblies and a first plurality of air mover modules;
   a first exhaust region between the first row of equipment and the first interior lateral wall such that air exhausted out of the back sides of first computers supported by the first plurality of rack assemblies is received into the first exhaust region and withdrawn from the first exhaust region by the first plurality of air mover modules; and
   a plurality of air deflectors provided in the first exhaust region;
   wherein the first plurality of rack assemblies comprises a first rack assembly and a second rack assembly adjacent to the first rack assembly;
   wherein the first plurality of air mover modules includes:
      a first air mover module adjacent to the first rack assembly; and
      a second air mover module adjacent to the second rack assembly;
   so that the first rack assembly and the second rack assembly are positioned between the first air mover module and the second air mover module in the first row of equipment; and
   wherein at least one of the first plurality of air deflectors is positioned between the first rack assembly and the second rack assembly in the first exhaust region to:
      direct first air exhausted out of the back sides of computers mounted in the first rack assembly toward the first air mover module;
      direct second air exhausted out of the back sides of computers mounted in the second rack assembly toward the second air mover module;
   to thereby reduce mixing of the first air and the second air in the first exhaust region.

2. The system of claim 1, further comprising:
   a second row of equipment provided along the second interior lateral wall, wherein the second row of equipment comprises a second plurality of rack assemblies and a second plurality of air mover modules; and
   an aisle provided between the first row of equipment and the second row of equipment;
   wherein the first plurality of air mover modules is for moving air between the first exhaust region and the aisle; and
   wherein each of the first plurality of air mover modules directs air towards the second row of equipment.

3. The system of claim 2, further comprising:
   a second exhaust region between the second row of equipment and the second interior lateral wall such that air exhausted out of the back sides of second computers supported by the second plurality of rack assemblies is received into the second exhaust region and withdrawn from the second exhaust region by the second plurality of air mover modules;
   wherein the second plurality of air mover modules is for moving air between the second exhaust region and the aisle; and
   wherein each of the second plurality of air mover modules directs air towards the first row of equipment.

4. A computing system, comprising:
   a housing having an interior lateral wall;
   a row of equipment positioned along the interior lateral wall, the row of equipment including a first air mover module, a second air mover module, and a pair of rack assemblies between the first air mover module and the second air mover module, the pair of rack assemblies including:
      a first rack assembly adjacent to the first air mover module; and
      a second rack assembly adjacent to the second air mover module;
   an exhaust region between the row of equipment and the interior lateral wall;
   an air deflector positioned between the first rack assembly and the second rack assembly in the first exhaust region, the air deflector comprising two vertically oriented panels coupled at an angle, the two vertically oriented panels including a first panel and a second panel;
   wherein first air exhausted from computers in the first rack assembly is directed by the first panel toward the first air mover module, and second air exhausted from computers in the second rack assembly is directed by the second panel toward the second air mover module.

5. The computing system of claim 4, wherein the first air mover module and the second air mover module each comprise:
   a fan assembly portion comprising one or more air movers; and
   a cooling portion for cooling air passing through the air mover module.

6. The system of claim 5, wherein:
   each air mover module directs air towards an opposing row of equipment.

7. The system of claim 5, wherein:
   each air mover module directs air across the front sides of computers in the same row of equipment as the air mover module.

8. The system of claim 5, wherein:
   the cooling portion comprises a radiator coupled to an intake line for receiving a cooled heat transfer medium from a cooling system and an outlet line for discharging heated heat transfer medium.

* * * * *